United States Patent [19]

Schlig et al.

[11] 4,063,223
[45] Dec. 13, 1977

[54] NONDESTRUCTIVE CURSORS IN AC PLASMA DISPLAYS

[75] Inventors: Eugene Stewart Schlig, Somers; George Raymond Stilwell, Jr., West Nyack, both of N.Y.

[73] Assignee: International Business Machines Corporation, Armonk, N.Y.

[21] Appl. No.: 713,567

[22] Filed: Aug. 11, 1976

[51] Int. Cl.$^2$ .......................................... G11C 11/28
[52] U.S. Cl. ........................... 365/116; 340/166 EL; 340/324 M; 315/169 R
[58] Field of Search ...... 340/173 R, 173 PL, 166 EL, 340/324 M; 315/169 R

[56] References Cited
U.S. PATENT DOCUMENTS

| | | | |
|---|---|---|---|
| 3,559,190 | 1/1971 | Bitzer et al. | 340/173 PL |
| 3,662,352 | 5/1972 | Schott | 340/173 PL |
| 3,969,715 | 7/1976 | Lamoureux | 340/324 M |

Primary Examiner—Terrell W. Fears
Attorney, Agent, or Firm—John A. Jordan

[57] ABSTRACT

A nondestructive, transparent cursor for AC plasma displays may be superimposed electronically over a displayed image without regenerating the original image each time the cursor is moved. The cursor is displayed by means of a special cursor drive waveform which discharges both previously "on" and "off" cells which form the cursor but permits reversion of the cells to their original state when the cursor drive waveform is removed and the normal sustaining waveform is restored.

22 Claims, 8 Drawing Figures

NONDESTRUCTIVE CURSORS IN AC PLASMA DISPLAYS

BACKGROUND OF THE INVENTION

1. Field of the Invention

The present invention relates to gas discharge display and memory devices. More particularly, the present invention relates to AC gas discharge display and memory devices having a nondestructive cursor function for displaying cursors for a variety of applications, such as computer graphics.

2. Description of the Prior Art

Gas discharge display and memory panels of the type to which the present invention pertains are well known in the art. For example, U.S. Pat. No. 3,499,167 to Baker et al describes such a panel. The gas panels of the type to which the present invention is directed typically have two glass plates maintained in spaced-apart relationship, and are arranged to have sealed between the spaced-apart plates an ionizable medium. To provide matrix addressability whereby selected local regions within the ionizable medium may be selectively ionized, sets of horizontal and vertical conductors are employed. Typically, the set of horizontal conductors comprises an array of parallel insulated conductors arranged on the inner surface of one plate and horizontally extending thereacross. Likewise, the set of vertical conductors comprise an array of parallel insulated conductors arranged on the inner surface of the other plate vertically extending thereacross, generally orthogonal to the horizontal conductors.

In such an arrangement, when an appropriate voltage is applied between a selected one of the horizontal conductors and a selected one of the vertical conductors, ionization occurs at the crossover point of the two conductors, such that light is emitted. Generally, the crossover points are referred to as "cells" and a display pattern or image is formed by ionizing selected cells. As another example of a panel as described and to which the present invention pertains, reference is made to an article by D. L. Bitzer et al entitled, "The Plasma Display Panel — A Digitally Addressable Display with Inherent Memory," Proceedings of the Fall Joint Computer Conference IEEE, San Francisco, Calif., November 1966, pp. 541–547.

Although the cursor function has been implemented in prior art AC gas discharge display and memory panels, such prior art implementations are such as to cause the information previously stored in those cells used to form the cursor, to be erased. Accordingly, the information stored within these cells would necessarily have to be regenerated by writing from an external memory after the cursor is moved or else the information is permanently lost. Thus, not only did such prior art cursor functions necessitate the use of an external memory for purposes of regenerating the former information state lost as a result of the formation of a cursor, but in addition, such cursor functions necessarily involved additional control circuitry to control the regeneration. As an example of such prior art cursor functions, reference is made to that described by Tucker et al in U.S. Pat. No. 3,852,721.

SUMMARY OF THE INVENTION

In accordance with the principles of the present invention, an AC gas discharge display and storage panel is provided with a cursor function having a movable, nondestructive cursor which may be superimposed over a displayed image without regenerating the original image each time the cursor is moved. The nondestructive feature of the cursor function is effected by means of special cursor drive waveforms which act to discharge both previously "on" and "off" cells to form the cursor in a manner so that upon cessation of the special drive waveforms, the cells which were addressed to form the cursor revert to their respective original storage states. The special cursor waveforms generally comprise a positive sustain pulse, a positive pulse of amplitude approximately twice that of the sustain, and a brief interval of approximately zero volts prior to an ensuing zero crossover. The zero crossover is typically achieved by a negative sustain pulse arranged to precede the next positive cursor pulse. In a four "rail" or bus arrangement, the cursor waveform is obtained in part by toggling latch actuated switches situated between the upper bus and lower buses of both the horizontal and vertical axes so as to derive the cursor waveform pulses.

By varying the frequency with which the cursor waveform is applied relative to the frequency with which the sustain pulses are applied, the cursor can be caused to exhibit contrast with respect to both lighted and dark regions of the displayed information and thereby be visible to the viewer in its entirety. Additionally, the cursor may be rendered effectively transparent to the viewer by "blinking" it off periodically, during which off intervals the underlying displayed information is sustained and is visible.

It is, therefore, an object of the present invention to provide an improved AC gas discharge display panel.

It is a further object of the present invention to provide an AC gas discharge display panel having a transparent movable cursor.

It is yet a further object of the present invention to provide an AC gas discharge display panel with nondestructive graphic cursors.

It is yet still a further object of the present invention to provide an AC gas discharge display panel with movable cursors which may be superimposed over displayed images without the necessity of having to regenerate the images each time the cursor is moved.

It is another object of the present invention to provide an AC gas discharge display panel with cursor function which operates without the necessity of external means for storing the information overwritten by the cursor until the cursor is removed or moved to a new position.

The foregoing and other objects, features and advantages of the invention will be apparent from the following more particular description of the preferred embodiments of the invention, as illustrated in the accompanying drawings.

1 via toggling to produce the horizontal line of a cross hair cursor.

Figure 4:
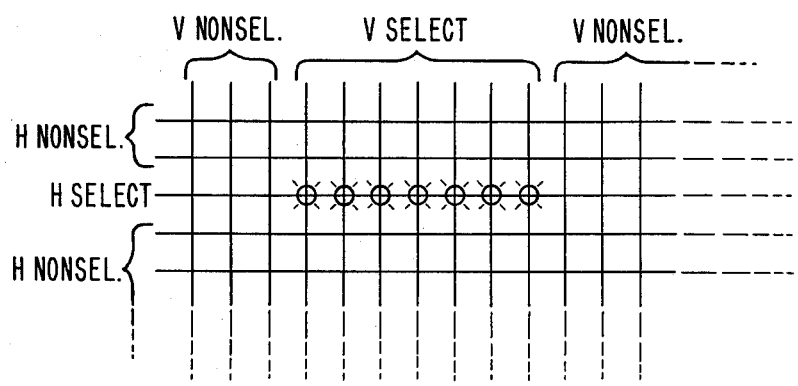

FIG. 4 shows a representation of a portion of a gas discharge panel wherein a portion of a horizontal line is selected to form an underline cursor.

Figure 5:
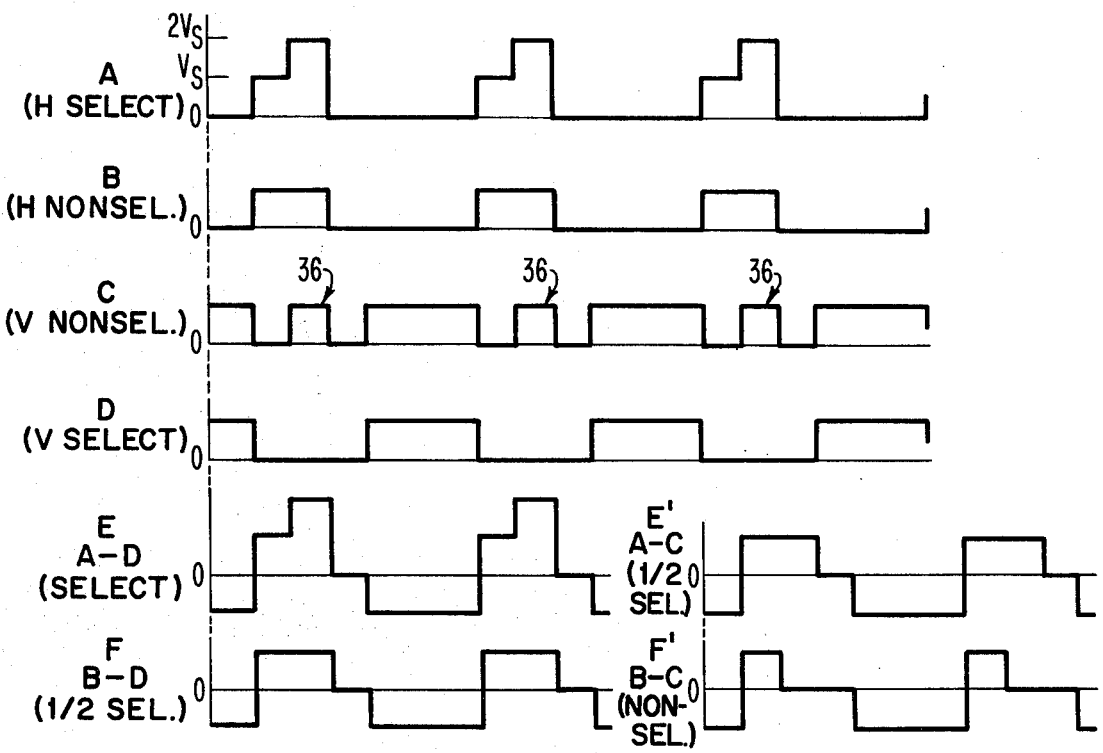

FIG. 5 shows a series of concurrent select and nonselect horizontal and vertical waveforms used to form the underline cursor of FIG. 4.

Figure 1:
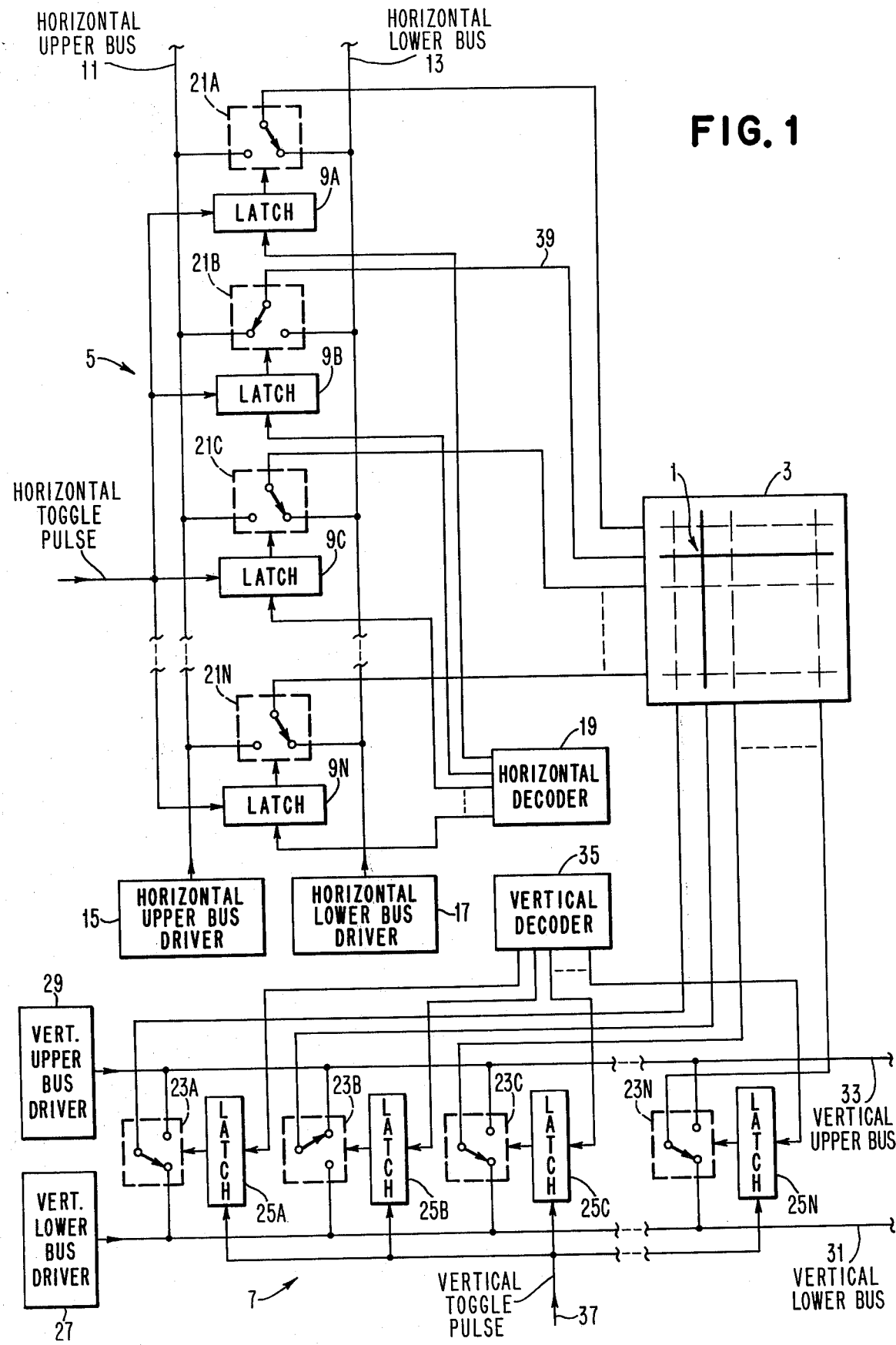
FIG. 1 shows a schematic of a four wall rail gas discharge display panel system wherein a system which incorporates toggling is used to form, for example, a cross hair cursor.
Figure 3:
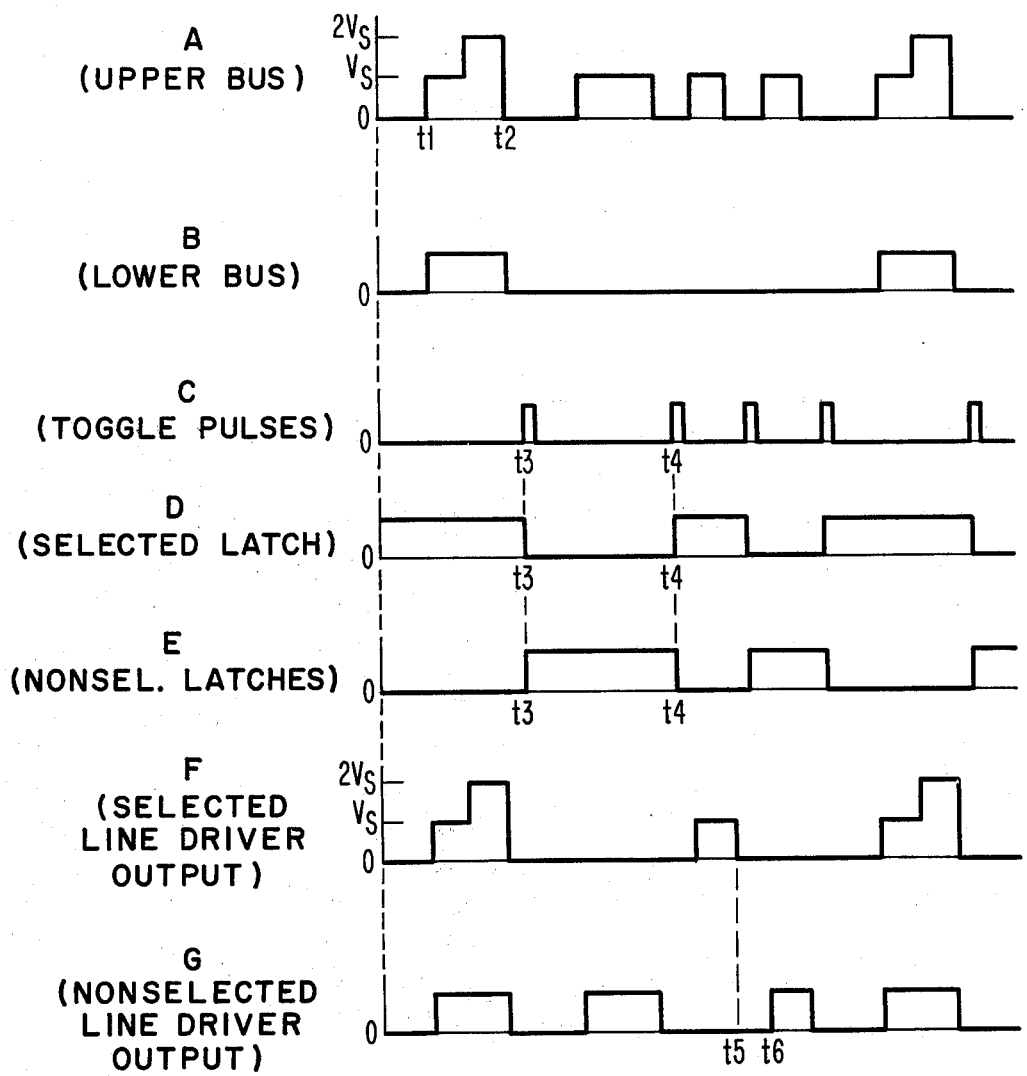
FIG. 3 shows a series of concurrent waveforms representative of the manner in which the horizontal sustain signals and cursor waveforms are achieved in FIG.
Figure 6:
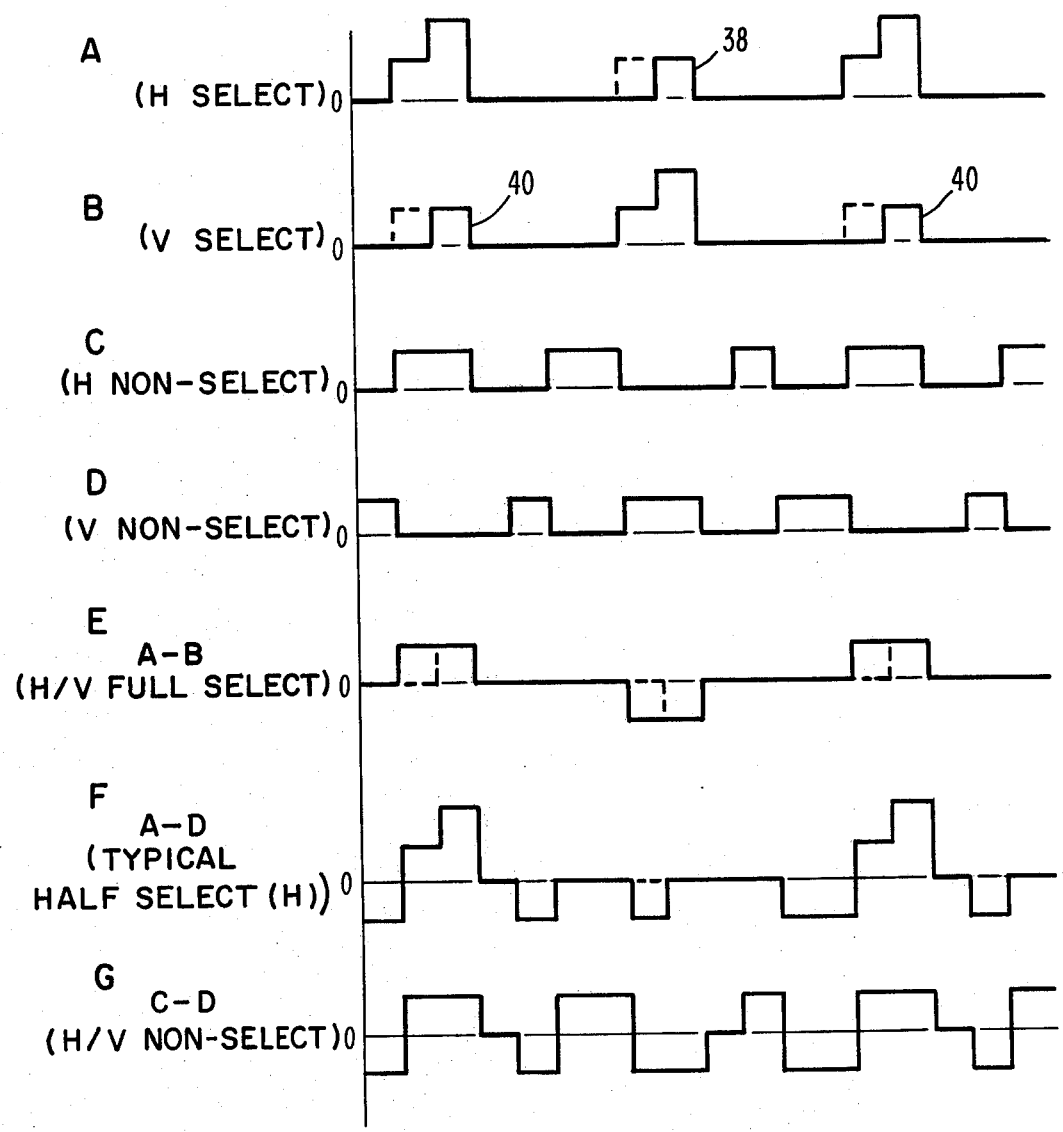

FIG. 6 shows a series of concurrent waveforms representative of the manner in which the horizontal and vertical select and nonselect signal waveforms of the cross hair cursor formed by the waveforms described with regard to FIGS. 1 and 3, operate to produce the cursor voltage waveforms.

Figure 7:
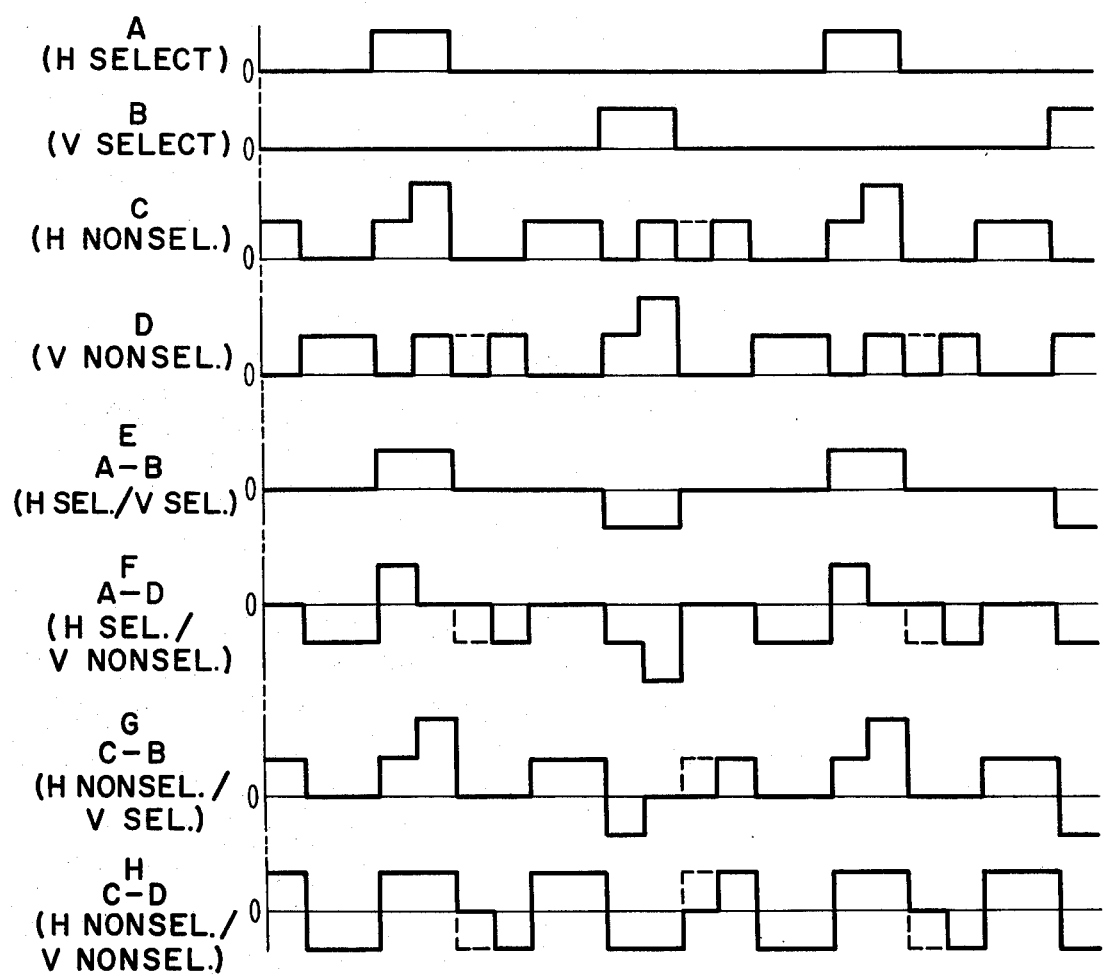

FIG. 7 shows a series of concurrent waveforms representative of the manner in which a modification of the cursor formed by the waveforms depicted by FIGS. 3 and 6 may be achieved.

Figure 8:
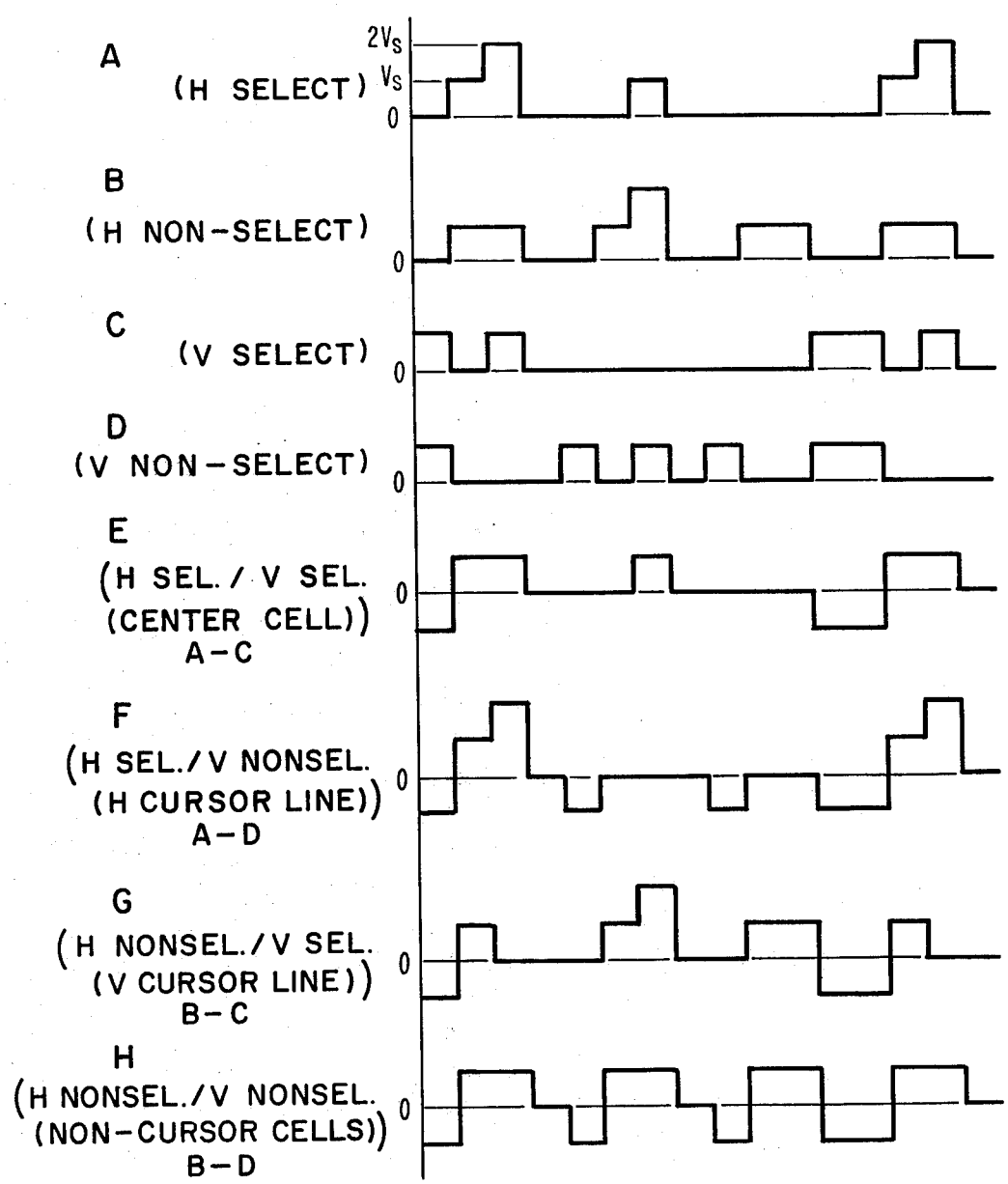

FIG. 8 shows a series of concurrent waveforms representative of a further modification formed by the combination of the two cursor arrangements, as depicted by the waveforms shown in FIGS. 3 and 6 on the one hand and FIG. 7 on the other.

DETAILED DESCRIPTION OF THE DRAWINGS

Figure 2:
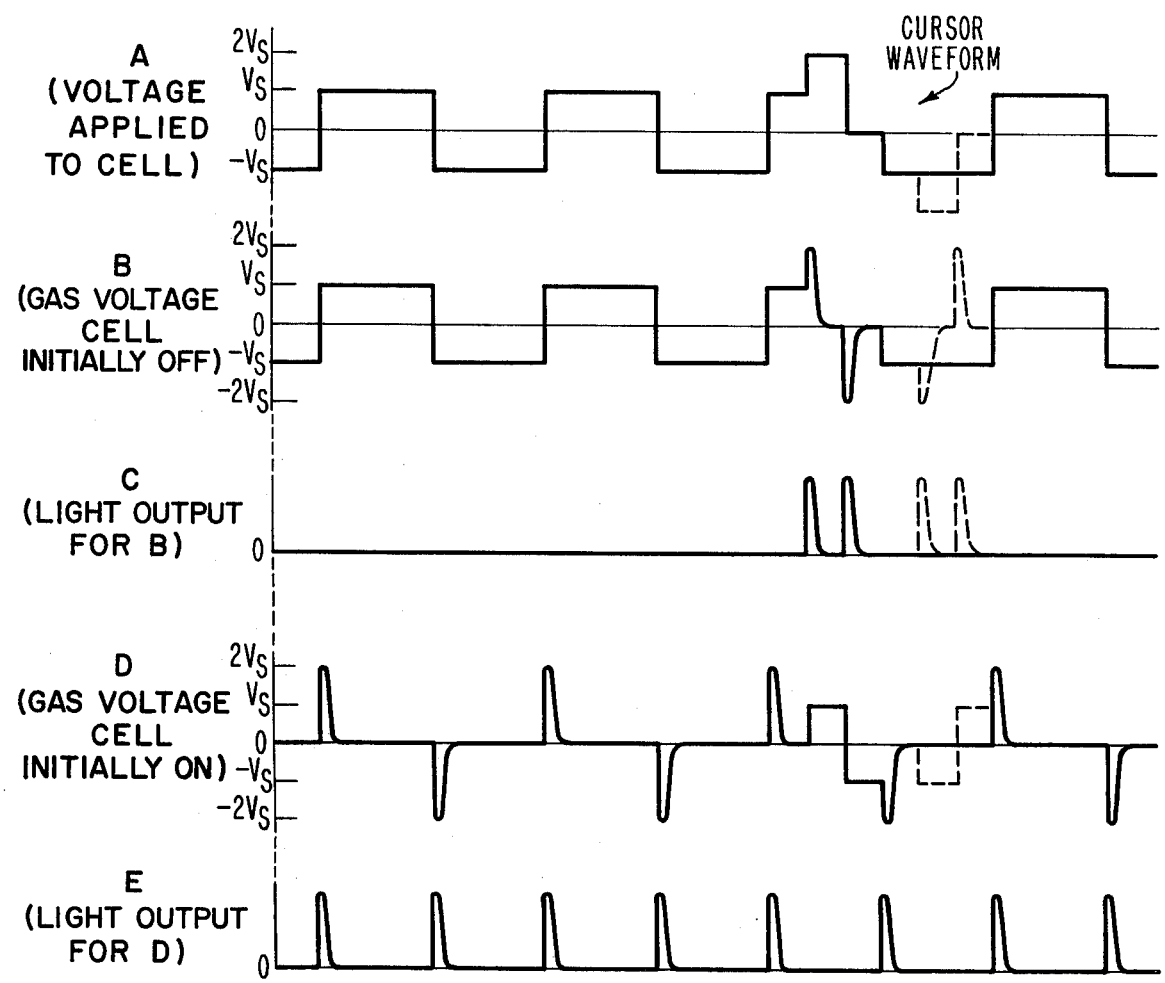
FIG. 2 shows the cursor voltage waveform, in accordance with the principles of the present invention, as it is applied across panel cells, and the light output obtained therefrom.

The nondestructive cursor function produced in accordance with the principles of the present invention by the waveforms shown in FIG. 2 may conveniently be implemented via the four rail or bus drive circuitry arrangement shown in FIG. 1. For a further description of four rail or bus drive circuitry per se, reference is made to copending application SN 372,384, entitled "Method and Apparatus for Gas Display Panel" by Criscimagna et al filed June 21, 1973 and assigned to the assignee of the present invention.

Before discussing the arrangement shown in FIG. 1, reference will first be made to the special cursor waveforms as depicted in FIG. 2. In its broadest aspect, the present invention describes a way of displaying a cursor without a loss in the memory state of the cells used to form the cursor. In other words, in accordance with the principles of the present invention, it has been found that a special waveform, when applied across a cell, will act to discharge the cell and cause the emission of light without their being a loss in the previous memory state of the cell, whether "on" or "off."

The waveform of line A in FIG. 2 shows the voltage across a cell (electrode to electrode) indicating a typical square sustain waveform being interrupted for one half cycle (third cycle) and being replaced by the special nondestructive cursor waveform in accordance with the principles of the present invention. In addition, FIG. 2 shows the gas voltage internal to the cell which in turn is the sum of the voltage applied to the cell and the wall voltage of the cell. The wall voltage results from charge stored on the dielectric walls and its magnitude determines the state of the cell, whether "on" or "off." The gas voltage is shown both for previously "on" and "off" cells. The light output for cells which are both previously "on" and "off" in response to the special cursor waveform is also shown in FIG. 2. In particular, it can be seen that the third cycle waveform of line B depicts the gas voltage (sustain plus wall voltage) for an initially "off" (zero wall voltage) cell. The manner in which the gas voltage responds to the special cursor waveform can be seen at the first half of the third cycle. Line C of FIG. 2 shows the light output pulses for the case where the cell in question is initially "off." Line D of FIG. 2 shows the gas voltage for a cell which is initially "on," and line E shows the light output pulses for such case. The broken lines depicted in the various waveforms of FIG. 2 represent an alternative scheme wherein the second half of the special cursor waveform does not follow the negative sustain waveform but rather emulates in the negative direction that which occurs in the positive direction over the first half cycle. $V_s$ as indicated at FIG. 2 represents the normal sustain amplitude.

FIG. 2 thus illustrates that, during full sustain cycle which begins with the modified sustain half cycle wherein the special cursor waveform is created, the cell fires and emits two light pulses when the cell being addressed is initially "off" and two light pulses when the cell being addressed is initially "on." On the other hand, when the normal sustain waveform is restored upon removal of the cursor, the cell reverts to its initial memory state. In this regard, the modified sustain waveform may persist as indicated for a full cycle or for any number of half cycles in accordance with the particular cursor needs. As can be seen, the cursor waveform is, in general, comprised of a voltage complex of three basic components, to wit, a pulse of given polarity of sustain amplitude, a pulse of the same polarity but approximately twice the sustain amplitude, and an interval of approximately zero volts. These three components are typically applied in direct sequence or succession, but they may also occur during separate time intervals as long as no voltage excursions which cause discharges, within the cells being addressed, intervene. In particular, it is required that no voltage excursions to significant levels of the opposite polarity may intervene during the three levels in question, i.e., sustain amplitude $V_s$, $2V_s$, and approximately zero voltage. It is clear, then, any of a variety of combinations may be possible without causing intervening discharge within the cell.

As can be seen, the particular cursor waveform in FIG. 2, line A, is comprised of a positive sustain pulse immediately followed by a positive pulse of amplitude approximately twice that of the sustain which, in turn, is immediately followed by a brief interval at approximately zero volts before an excursion of opposite polarity. In this regard, a negative sustain pulse must precede the next positive cursor pulse, i.e., there must be an excursion of opposite polarity before the next cursor waveform is applied. It should be noted that tolerances on the peak amplitude of the cursor pulse are relatively wide and the full normal sustain amplitude margin is retained.

Although in the toggled-latch arrangement shown in FIG. 1, as it operates in conjunction with the voltage waveforms of FIG. 3, the cursor waveform is applied selectively to the panel line along which the cursor is to be formed, other possibilities also exist as will be described in conjunction with FIGS. 7 and 8. For example, as represented by FIG. 7 the cursor waveform may be applied to all or several lines of the orthogonal axes (i.e., broadside to the cursor line) and the cursor waveform may be deselected everywhere except at the line on which the cursor is to appear. This alternative has the advantage of permitting unipolar voltages between the upper and lower buses of the drive system without the need to toggle the driver latches as is done in the arrangement of FIG. 1.

In the gas discharge display panel drive circuit arrangement shown in FIG. 1, a cross hair cursor 1, for example, may be formed as shown on panel 3 in conjunction with use of the voltage waveforms shown in FIG. 3. The horizontal line of the cursor is formed by drive circuitry 5 while the vertical line of the cross hair cursor is formed by vertical drive circuitry 7. As will be understood more fully hereinafter, the cursor waveforms used in FIG. 1 are derived in part by toggling the drive circuit latches in accordance with a succession of toggle pulses. Since FIG. 3 references the waveforms for the horizontal drive circuits 5, the detailed discussion of the operation will be primarily directed to the formation of the horizontal line cursor. As is understood by those skilled in the art, the operation of the vertical drive circuits to form the vertical line of the cursor is the same as the horizontal operation.

As shown in FIG. 1, latches 9A-9N in the horizontal drive circuitry act to latch switches 21A-21N. Switches 21A-21N are depicted schematically for illustrative purposes as single pole double throw switches. Typically, such latches would comprise bistable flip-flop circuits and such switches would comprise semiconductor switches with a single pole double throw function. Any of a variety of semiconductor switches may be used for such purposes.

As can be seen in FIG. 1, horizontal upper bus driver 15 feeds bus 11 and horizontal lower bus driver 17 feeds bus 13. Horizontal decoder 19, as is understood by those skilled in the art, acts to provide the decode logic for setting the initial states of latches 9A-9N in accordance with the information to be displayed upon panel 3. The horizontal upper and lower bus drivers 15 and 17 include the sustain waveform and the write and erase pulse generating means typically employed with the sustain waveforms to write and erase the panel as well as the waveforms required to display the cursor. The superposition of a write and erase pulse on a sustain pulse may be achieved in any of a variety of ways, as is understood by those skilled in the art. In a manner analogous to that described with regard to horizontal drive circuitry 5, the vertical drive circuitry 7 employs switching circuitry 23A-23N to switch back and forth between an upper and lower bus 33 and 31 respectively, to obtain the cursor waveforms. Latches 25A-25N are set in response to signals from vertical decoder 35 while toggle pulses inputted at 37 act to appropriately toggle the latches. Vertical upper bus driver 29 feeds vertical upper bus 33 while vertical lower bus driver 27 feeds lower bus 31.

With reference to FIG. 3, the waveform of line A shows the succession of pulses that occur on the horizontal upper bus during the cursor mode. It should be understood that when the cursor mode is not employed, the four bus or rail system operates in a conventional manner whereby each line of each axis of the panel receives 180° out of phase sustain pulses to sustain the information written into the panel. Typically, the upper bus of each axis applies the sustain pulses with the write and erase pulses being superimposed thereupon at appropriate times via a transformer or the like. The lower bus of each axis may comprise a separate sustainer pulse source or, alternatively, may derive its pulses from same sustainer pulse source as the upper bus driver. At write or erase time, then, the latches may be set so that all but the selected lines derive the sustain waveforms from the lower bus.

As is evident by comparing lines F and G of FIG. 3, neither the selected line driver output or the nonselected line driver output is always at a higher potential than the other. If the waveform of line F were applied directly to, for instance, upper bus 11 while that of line G were applied to lower bus 13, a bipolar potential would appear across switches 21A-21N. Particular constraints would then be imposed upon the type of switches 21A-21N that could be employed. For example, various forms of unipolar semiconductor switches could not be employed or would be much more difficult to employ.

In order that the potential between buses 11 and 13 of FIG. 1 be unipolar, the higher potential pulses of those shown on lines F and G of FIG. 3 are applied by driver 15 to bus 11, while the lower potential pulses are applied by driver 17 to bus 13. The resulting waveforms on buses 11 and 13 are shown on lines A and B respectively of FIG. 3.

By toggling latches 9A-9N by means of toggle pulses applied to all of the latches 9A-9N simultaneously, switches 21A-21N are caused to change their states simultaneously in such a manner that the state of selected switch 21B is always opposite to that of nonselected switches 21A and 21C-21N. These toggle pulses may conveniently be timed to occur at intervals when both buses 11 and 13 are at zero potential. The effect of the application of the toggle pulses is to cause the pulses on buses 11 and 13 to be redistributed among the selected and nonselected line driver outputs so that the waveforms of lines F and G of FIG. 3 are obtained, as will be explained in greater detail.

With the horizontal upper bus driver 15 in FIG. 1 producing the waveform of line A in FIG. 3 on upper bus 11, during the interval from T1 to T2, the cursor waveform is produced on selected line 39 connected to switch 21B. In this regard, the waveform of line F of FIG. 23 shows the selected line driver output circuit from switch 21B. As shown by the waveform of line C in FIG. 3 at time T3 a toggle pulse acts to reverse the state of the latches 9A-9N as depicted by the waveforms of lines D and E. Accordingly, switch 21B now sees the lower bus potential which is at ground level. On the other hand, the nonselected line driver circuits 21A, 21C..21N see the potential on the upper bus 11. At time T4, another toggle pulse acts to reverse the latches again. As can be seen, the successive toggle pulses act to switch the selected and nonselected lines back and forth between the upper and lower buses such that the waveforms of lines F and G are produced. In accordance with such a scheme, the cursor waveform applied to selected line 39 of the panel is such as to be produced every third cycle of the sustain cycle. On the other hand, a modified sustain waveform is applied to the nonselected lines of the panel in which each third sustain pulse is reduced in duration to provide the required interval at zero volts following each vertical cursor pulse. It should be appreciated that the waveform shown in line F comprises the potential applied to one line of the cells addressed thereby. The other portion of the potential applied across the cells is obtained from the vertical drive circuitry 7. Each of the nonselected cells broadside to the vertical line of the cursor receive modified sustain pulses while the cells on selected vertical line sees the special vertical cursor pulses interposed between the horizontal cursor pulses shown in line F.

In the arrangement shown in FIG. 3, the cursor pulse waveform is arranged in a one half width mode, such that the $V_s$ level exists over one half of the sustain half cycle T1 to T2 and the $2V_s$ level exists over the other half of the sustain half-cycle. In order to obtain the required approximately zero voltage interval prior to an excursion in the opposite direction for the cursor voltage applied across the cell as shown in FIG. 2, the zero level is borrowed from the opposing half-cycle voltage signal. Thus, as shown in FIG. 3, the third pulse in the waveform of line G has been shortened by an interval T5 to T6 so that the vertical cursor waveform may use this interval as its required zero voltage level. In this regard, it should be appreciated that, although the arrangement in FIG. 3 shows what has been characterized as the one half width mode, it is possible to divide the half-cycle of the sustain signal into thirds whereby the levels $V_s$, $2V_s$ and zero volts may be achieved within this time. A one-third width mode of operation is embodied in the arrangement depicted in FIGS. 4 and 5. Alternative arrangements in which the various levels have other durations such as one-half sustain cycle or longer are feasible. In this regard, it should be appreciated that the exact manner in which the required sequence of voltage levels is obtained is somewhat a matter of choice, and that any of a variety of techniques may be utilized to achieve same.

As an alternative to the cross hair cursor described with reference to the waveforms shown in FIG. 3 as carried out by the circuit arrangement shown in FIG. 1, an underline cursor function may be described as shown in FIG. 4 and carried out by the circuit of FIG. 1 using the voltage waveform shown in FIG. 5. As can be seen, the underline cursor in FIG. 4 comprises a seven-dot horizontal line cursor. It is clear that the cursor could likewise be vertical, and any number of dots utilized. It should be appreciated that, in addition to an underline cursor, a rectangular block-type cursor may also be generated. As a matter of fact, any of a variety of geometric configurations may be implemented by the selection and nonselection of appropriate lines and the appropriate toggling of latches, when needed, so that the proper waveforms are presented to the panel.

In the waveforms of FIG. 5, no toggling is needed because the horizontal select waveform, line A of FIG. 5, is never lower in potential than the nonselect waveform of line B, and also the vertical nonselect waveform, line C, is never lower in potential than the select waveform of line D. Thus waveforms A and C may be applied to the horizontal and vertical upper buses 11 and 33 of FIG. 1 respectively, and waveforms B and D may similarly be applied to lower buses 13 and 31 respectively. Horizontal switches 21A–21N of FIG. 1 would then be set in the states indicated in FIG. 1 while the vertical switches 23A–23N would be set in states opposite to those indicated in FIG. 1. Appropriate waveforms as per lines A–D of FIG. 5 would then appear on appropriate output lines without the necessity of toggling the latches.

With reference to FIG. 5, it can be seen that the horizontal select pulses of line A establish the $V_s$ and $2V_s$ cursor waveform voltage levels required to produce the cursor. The combination of the horizontal select pulses of line A and the vertical select pulses of line D act to form the cursor waveform select voltage shown in line E. The cursor waveform voltage pulse as implemented here occurs over every sustain cycle. As shown in lines F, E′ and F′, the three nonselect voltage waveforms occurring across the respective cells in the quadrants outside of the cursor compare quite closely to conventional sustain waveforms. These waveforms readily carry out the sustain function, as required thereby.

Referring to the "H select" line of FIG. 4, the extension of the cursor along this line beyond the indicated seven cells is avoided by the use of deselect pulses 36 which appear on line C of FIG. 5. These pulses appear on nonselect vertical lines simultaneously with the $2V_s$ pulses on the horizontal select line and act to reduce the total applied voltage on the cells at the intersection of those lines so that it never exceeds $V_s$ as indicated on line E′ of FIG. 5. Thus the cursor does not appear on such cells, which instead sustain and display the normal information pattern stored therein.

FIG. 6 shows a series of concurrent voltage waveforms which are an extension of the voltage waveforms shown in FIG. 3 and described in conjunction with FIG. 1, showing the manner in which they act to produce the cross hair cursor embodied thereby. While FIG. 3 depicts the manner in which the arrangement of FIG. 1 toggles the respective latches to produce the appropriate horizontal selected and nonselected driver output voltage signal waveform, FIG. 6, on the other hand, depicts the manner in which both the horizontal and vertical select and nonselect signal waveforms act to combine to form the various voltage signal waveforms across the respective cells of the panel. As can be seen, line A of FIG. 6 shows the horizontal select signals, the same as shown in line F of FIG. 3. Line B of FIG. 6 shows the vertical select signals which alternate between the horizontal select signals. Lines C and D show, respectively, the horizontal and vertical nonselect signals, the same as the nonselect signals shown in line G of FIG. 3. Line E of FIG. 6 shows the full select voltage waveform signal as it appears across the panel cell corresponding to the center dot of the cursor. This waveform, it can be seen, is obtained by subtracting the waveform shown in line B from the waveform shown in line A.

It should be noted that the full select center dot voltage waveform acts to produce light output from the panel cell corresponding to the center dot different from that of the cells corresponding to the lines of the cursor. Thus, the center dot light output states will vary in accordance with the initial state of the cell corresponding to the center dot. Where the cell corresponding to the center dot was initially "off," the center dot is also "off" when the cursor is "on." On the other hand, when the cell corresponding to the center dot was initially "on," then when the cursor is "on" the center dot is at one third brightness. This appearance of the center dot is achieved by means of deselect pulses 38 and 40 of lines A and B respectively of FIG. 6. These pulses are applied to the select waveforms coincidently with the $2V_s$ pulse of the select waveforms of the axis orthogonal thereto, subtracting from the amplitude of those $2V_s$ pulses. This prevents the $2V_s$ pulses from appearing across the cell corresponding to that center dot, which instead sustains at one-third the normal frequency as shown in line E of FIG. 6. This, of course, is one examplary scheme, and it is clear that any of a variety of alternative schemes may readily be implemented in accordance with the principles of the present invention.

The waveform of line F of FIG. 6 shows the half select cursor voltage waveform as it applied to the cells of the horizontal line of the cross hair cursor. As is evident, these waveforms are obtained by subtracting the waveform of line D from the waveform of line A. The waveform of line G of FIG. 6, on the other hand, shows the nonselect voltage waveform as it appears across the cells other than the cells corresponding to the cross hair cursor. As is likewise evident, this latter voltage waveform is obtained by subtracting the voltage waveform of line D from the voltage waveform of line C, and it acts to sustain the normal information pattern stored in the cells to which it applies.

One of the possible variations of the waveforms of FIG. 6 which result in an identical cursor appearance is shown by broken lines in FIG. 6, which represent extensions of the pulses represented by solid lines.

FIG. 7 shows a series of concurrent waveforms wherein, as hereinabove mentioned, the circuit of FIG. 1 operates to apply the cursor waveform to all or several of the lines orthogonal, i.e., broadside to the cursor line, and the cursor waveform is then deselected everywhere except at the line on which the cursor is to appear. Stated another way, in the arrangement depicted by FIG. 7, the $V_s$ and $2V_s$ portion of the cursor waveform are provided on the horizontal and vertical nonselect lines, while the lower voltage sustain-type signal is provided on the horizontal and vertical select lines. As can be seen, with the cursor arrangement depicted by FIG. 7, the $V_s$ and $2V_s$ levels of the cursor waveform are half the width of a sustain signal, while the "back porch," i.e., the zero level portion of the cursor waveform, is the full width of a sustain signal. As can be seen, the full select voltage waveform shown in line E is obtained by subtracting the voltage waveform in line B from the voltage waveform shown in line A. Likewise, the half select voltage waveform shown in line F is obtained by subtracting the voltage waveform in line D from the voltage waveform in line A. In like manner, the half select voltage waveform shown in line G is obtained by subtracting the voltage waveform shown in line B from the voltage waveform shown in line C. Finally, the nonselect voltage waveform of line H is obtained by subtracting the voltage waveform of line D from the voltage waveform of line C.

The appearance of the cursor is identical to that of FIG. 6. Again in FIG. 7, one of the possible alternative waveforms is indicated by broken lines.

FIG. 8 depicts a series of voltage waveforms representative of an alternative way in which the cross hair cursor may be produced by the driving circuitry of FIG. 1. The cross hair produced in the manner represented by the waveforms of FIG. 8 is also of one third brightness, and identical in appearance with the cursors of FIGS. 6 and 7. In principle, this cursor is produced by forming one of the cursor lines, such as the horizontal line, by application of the $V_s$ and $2V_s$ cursor pulse to the selected horizontal line, and forming the other cursor line (i.e., vertical) by applying the cursor pulse to all nonselected lines or the orthogonal axis (i.e., all nonselected horizontal lines). In this way, the high voltage pulses need only be applied to the lines of one axis of the display.

Thus, as shown in FIG. 8, the waveforms of line A depicts application of the cursor waveform to the horizontal select line. In addition, as shown by line B, the cursor waveform is applied to the horizontal nonselect lines. As shown by the waveform of line F, the half select horizontal full cursor voltage waveform is obtained by subtracting the voltage waveform of line D from the voltage waveform of line A. Likewise, the half select vertical cursor line shown in line G of FIG. 8 is obtained by subtracting the waveform shown in line C from the waveform shown in line B.

The waveforms of lines A and B of FIG. 8 may be produced by the horizontal part of the system of FIG. 1, for instance by applying the higher voltage pulses of lines A and B to upper bus 11 and the lower voltage pulses to lower bus 13. The waveforms of lines A and B are then obtained at the appropriate line driver outputs by toggling the latches in a manner analogous to that discussed with reference to FIG. 3, except that the timing of the toggle pulses will be different from that shown in FIG. 3. Similarly waveforms of lines C and D of FIG. 8 may be produced by the vertical part of the system of FIG. 1.

The waveforms of FIG. 7 may also be produced by the system of FIG. 1. By comparing the waveform of lines A of FIG. 7 to that of line C, and line B to line D, it may be observed that the potential of the nonselect output of each axis is never lower than the potential of the select output of the corresponding axis. For this reason it is feasible to apply the nonselect waveforms directly to the appropriate upper buses and the select waveforms directly to the appropriate lower buses. In contrast to the indicated states of the line driver switches of FIG. 1, the selected switches would now connect their output to the lower buses while the nonselect switches connect their output to the upper buses, and toggling is not required.

In the cases of FIGS. 6–8, the brightness of the cursor lines is one-third that of the displayed (sustained) information because the cursor pulses are applied at one-third the rate at which sustain pulses are applied. In the case of FIG. 5, the brightness of the cursor and the information are equal because the frequencies are equal. In all cases, other brightness ratios may be obtained by means of other frequency ratios.

Additionally, many other sequences of pulses than those shown in FIGS. 5–8 can be used to produce substantially the same cursor appearance. In the particular cases of the cross hair cursors, the appearance of the center cell of the cross hair and its relation to the underlying displayed information may be modified by means of minor modifications to the waveforms of FIGS. 6–8. Such modifications can be readily devised by one tutored in the art disclosed herein.

In the case of all forms of the cursor, it may be desired to blink the cursor on and off periodically to permit the displayed information underlying the cursor also to be viewed and to attract the eye to the information to which the cursor points. This blinking is accomplished by applying the cursor waveform for an interval, for example of one-third second, then applying ordinary sustain waveforms to the entire panel for one-half second, and so on. In the transition between the cursor waveform and the normal sustain interval, when blinking or simply initiating or ending the cursor mode, it is necessary to effect the transition between waveforms in such a way that the sequence of levels of the cursor pulse, i.e., $V_s$, $2V_s$ and zero volts, is not interrupted.

It is to be understood that although reference has been made herein to nondestructively forming a cursor by a special waveform, the special waveform and techniques pertaining thereto described herein could as readily be applied to form any sort of mark or image on the display panel for any of a variety of purposes or applications without there being a loss in the memory state of the panel cells used to form the mark or image. Accordingly, cursor as used herein should be taken to mean anything displayed on the panel through ionization of panel cells to cause light emission therefrom.

While the invention has been particularly shown and described with reference to preferred embodiments thereof, it will be understood by those skilled in the art that various changes in form and details may be made therein without departing from the spirit and scope of the invention.

What is claimed is:

1. A method of causing light emission from selected cells of an AC gas discharge display panel without loss of the previous memory state of said selected cells by applying a voltage waveform thereto comprising successive voltage complexes each having, at least a first component of at least one voltage level having a magnitude approximately equal to that of the magnitude of the sustain voltage level $V_s$ for said display panel, at least a second component of at least one voltage level having a polarity the same as the polarity of said at least one voltage level of said first component and a magnitude approximately equal to twice that of the sustain voltage level $V_s$, and at least a third component of at least one voltage level approximately equal to zero volts.

2. The method of claim 1 wherein said voltage complex includes at least an excursion of amplitude approximately $V_s$ and a polarity opposite to that of said first and second components after the occurrence of said third component and prior to the occurrence of the next of the said successive voltage complexes of said voltage waveform.

3. The method of claim 2 wherein said voltage complexes are applied to said selected cells to form a cursor for said display panel with said cursor superimposed over any information displayed by panel cells used to form the cursor without the loss of said information when said cursor is removed.

4. The method of claim 3 wherein said first and second components are applied to selected horizontal and vertical lines of said display panel while waveforms of amplitude approximately $V_s$ are applied to nonselect horizontal and vertical lines.

5. The method of claim 4 wherein both said first and second components applied to select lines and waveforms of amplitude equal to approximately $V_s$ applied to said nonselect lines are produced on one bus for said display panel with said voltage complexes and waveforms of amplitude equal to approximately $V_s$ sorted out for application to the appropriate select and nonselect lines by switching between said one bus and another bus for said panel.

6. A method of forming a cursor on the display panel of an AC gas discharge display and memory system comprising:
   applying successive voltage complexes across the display panel cells selected to form said cursor so as to cause light emission therefrom without a loss in the previous memory state of said cells,
   each of said voltage complexes including at least,
   a first component of at least one voltage level of a magnitude approximately equal to the magnitude of the sustain voltage level $V_s$ for said display panel,
   a second component of at least one voltage level of a polarity the same as and a magnitude approximately equal to twice that of the sustain voltage level $V_s$ for said display panel, and
   a third component of at least one voltage level of approximately zero volts.

7. The method as set forth in claim 6 wherein each of said voltage complexes undergoes an excursion in a direction opposite in polarity to that of said first and second components prior to the occurrence of the next complex of said successive complexes.

8. The method as set forth in claim 7 wherein said gas discharge display and memory system includes an upper and lower bus associated with the respective horizontal and vertical axis thereof, and wherein said first and second components of said voltage complexes are applied to the said upper and lower bus for at least one of said axes so that one bus is always at a voltage potential which is larger in magnitude than the potential of the other bus.

9. The method as set forth in claim 8 wherein said first and second components are applied to particular ones of the horizontal and vertical lines of said display panel by switching said particular ones of said horizontal and vertical lines between respective ones of said upper and lower buses.

10. The method as set forth in claim 9 wherein said first and second components are applied to the select lines of said horizontal and vertical lines and signals of amplitude approximately $V_s$ are applied to the nonselect lines of said horizontal and vertical lines.

11. The method as set forth in claim 9 wherein said first and second components are applied to the nonselect lines of said horizontal and vertical lines and signals of amplitude approximately $V_s$ are applied to the select lines of said horizontal and vertical lines.

12. The method as set forth in claim 9 wherein said first and second components are applied to both the select and nonselect lines of at least one of said axes of said display panel.

13. The method as set forth in claim 9 wherein said voltage complexes are applied intermittently to the said panel cells forming said cursor such that a first succession of said complexes are applied to said cells for a given interval of time and then said complexes are removed for a second interval of time whereby a blinking cursor function is performed.

14. The method as set forth in claim 9 wherein deselect pulses are applied to particular lines of the axis orthogonal to the axis receiving said voltage complexes so as to thereby prevent the appearance of said cursor on cells addressed by said particular lines.

15. The method as set forth in claim 6 wherein said voltage complexes occur at a frequency different from the sustain frequency for said display panel.

16. The method as set forth in claim 15 wherein the frequency of said voltage complexes is one-third that of the sustain frequency.

17. The method as set forth in claim 6 wherein the time duration of said first and second components is equal to one-half of the time duration of the sustain cycle for said display panel.

18. The method as set forth in claim 6 wherein the time duration of a voltage complex of said voltage complexes is equal to one-half of the time duration of the sustain cycle for said display panel.

19. The method as set forth in claim 6 wherein the time duration of said first, second and third components is equal to one-half of the time duration of the sustain cycle for said display panel.

20. In an AC gas discharge display system including an AC display panel and drive circuitry means therefor with said driver circuitry means having both horizontal and vertical drive circuitry means for providing addressing and sustain pulses to the respective horizontal and vertical lines of said panel, the improvement comprising a drive circuitry arrangement for providing a nondestructive cursor to said panel, said drive circuitry arrangement comprising, pulse means in each of said horizontal and vertical drive circuitry means for providing voltage complexes to particular ones of said horizontal and vertical lines to form said nondestructive cursor, said pulse means providing voltage complexes each having at least a first component of at least one voltage level having a magnitude approximately equal to that of the magnitude of the sustain voltage level $V_s$ for said display panel, at least a second component of at least one voltage level having a polarity the same as the polarity of said at least one voltage level of said first component and a magnitude approximately equal to twice that of the sustain voltage level $V_s$, and at least a third component of at least one voltage level approximately equal to zero volts.

21. The system as set forth in claim 20 wherein said voltage complexes each include at least an excursion of polarity opposite to that of said first and second components after the occurrence of said third component and prior to the occurrence of the next of the said successive voltage complexes of said voltage waveform.

22. The system as set forth in claim 21 wherein each of said horizontal and vertical drive circuitry means includes an upper and lower bus and means for switching between said upper and lower bus so that the voltage levels applied to one bus may always be at least as large as the other.

* * * * *